United States Patent [19]

Hayakawa

[11] Patent Number: 5,856,994
[45] Date of Patent: *Jan. 5, 1999

[54] LASER-DIODE-PUMPED SOLID-STATE LASER USING INDEX-GUIDED TYPE MULTI-TRANSVERSE MODE BROAD AREA LASER

[75] Inventor: Toshiro Hayakawa, Kanagawa-ken, Japan

[73] Assignee: Fuji Photo Film Co., Ltd., Kanagawa-Ken, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 747,741

[22] Filed: Nov. 12, 1996

Related U.S. Application Data

[63] Continuation of Ser. No. 323,733, Oct. 17, 1994.

[30] Foreign Application Priority Data

Dec. 1, 1993 [JP] Japan ................................. 5-301437

[51] Int. Cl.⁶ .................................................. H01S 3/091
[52] U.S. Cl. ............................... 372/75; 372/49; 372/46; 372/92
[58] Field of Search ............................... 372/92, 45, 46, 372/50, 93, 75, 49

[56] References Cited

U.S. PATENT DOCUMENTS

| | | | |
|---|---|---|---|
| 4,326,176 | 4/1982 | Aiki et al. | 372/45 |
| 4,694,459 | 9/1987 | Burnham et al. | 372/45 |
| 4,998,258 | 3/1991 | Ikeda et al. | 372/49 |
| 5,003,548 | 3/1991 | Bour et al. | |
| 5,278,851 | 1/1994 | Goto | 372/22 |
| 5,345,456 | 9/1994 | Dai et al. | 372/45 |
| 5,636,232 | 6/1997 | Goto | 372/22 |

FOREIGN PATENT DOCUMENTS 0 277 768  of 0000  European Pat. Off. .

OTHER PUBLICATIONS

IEEE Journal of Quantum Electronics, vol. 26, No. 10, pp. 1713–1716 dated Oct., 1990.
IEEE Journal of Quantum Electronics, vol. 27, No. 6, pp. 1537–1543 dated Jun., 1991.
IEEE Photonics Technology Letters, vol. 3, No. 2, pp. 97–99 dated Feb., 1991.
Applied Optics, vol. 31, No. 9, pp. 1318–1321 dated Mar., 1992.
IEEE Journal of Quantum Electronics, vol. 28, No. 4, pp. 1139–1141 dated Apr., 1992.
Chang–Hasnain et al; "Spatial Mode Structure of Index–Guided Broad–Area Quantum–Well Lasers";IEEE JQE, vol. 26, No., 10 Oct. 1990.

*Primary Examiner*—Leon Scott, Jr.
*Attorney, Agent, or Firm*—Sughrue, Mion, Zinn, Macpeak & Seas, PLLC

[57] ABSTRACT

A laser-diode-pumped solid-state laser in which a solid-state laser crystal is pumped by a laser beam emitted from a laser diode. An index-guided type multi-transverse mode broad area laser having a single optical waveguide is used as the laser diode. This leads to reduced output variations and noise of the laser. Preferably, the front reflectivity of the laser with respect to the oscillation wavelength of the laser should be more than 20%.

8 Claims, 8 Drawing Sheets

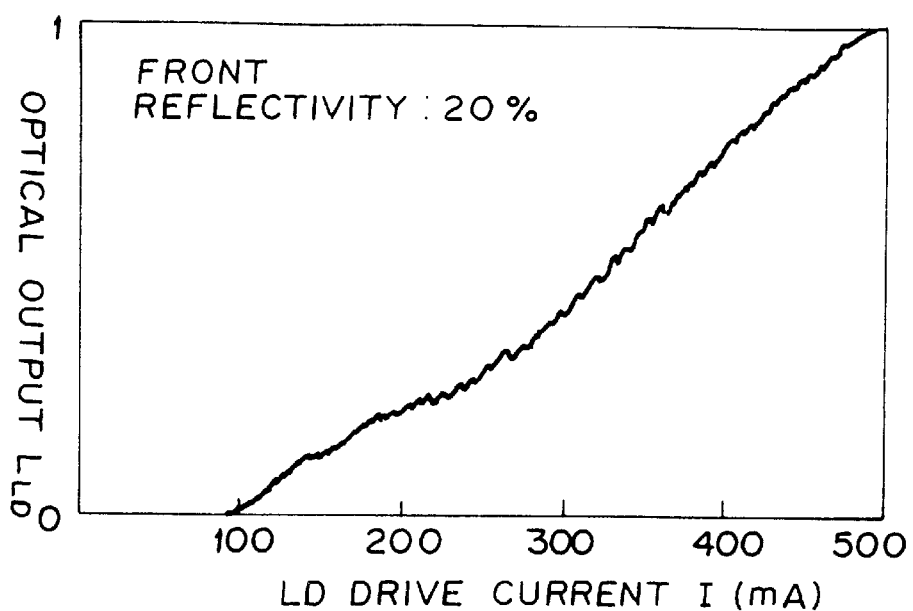
F I G. 7
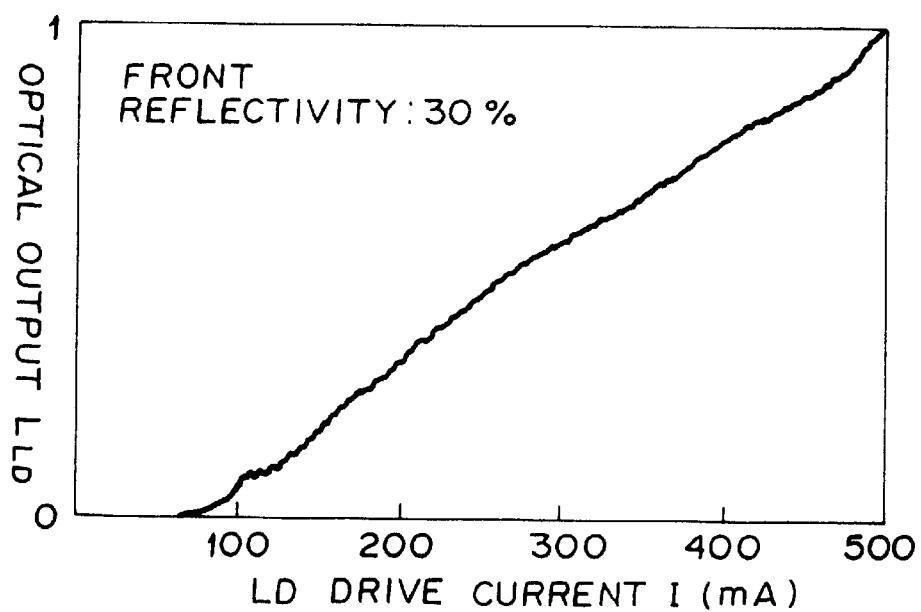
F I G. 8

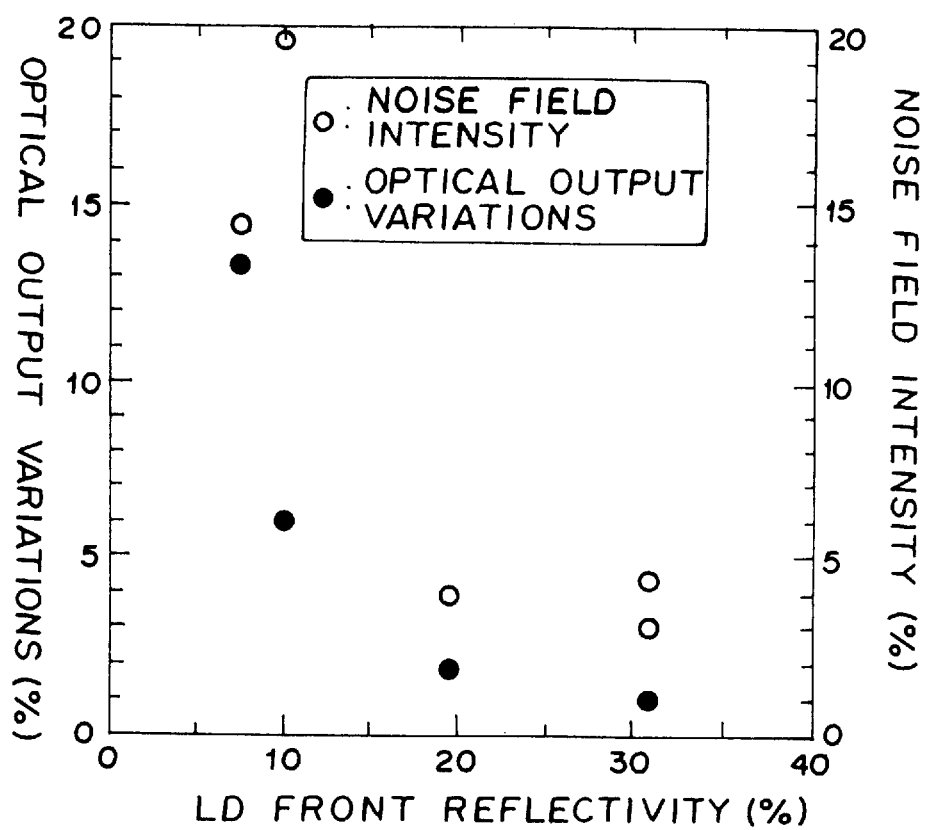

LASER-DIODE-PUMPED SOLID-STATE LASER USING INDEX-GUIDED TYPE MULTI-TRANSVERSE MODE BROAD AREA LASER

This is a Continuation of application Ser. No. 08/323,733, filed Oct. 17, 1994.

BACKGROUND OF THE INVENTION

1. Field of the Invention

This invention relates to a laser-diode-pumped solid-state laser, and more particularly to a laser-diode-pumped solid-state laser in which output variations and noise are reduced.

2. Description of the Prior Art

As disclosed in, for example, U.S. Pat. No. 4,656,635, a laser-diode-pumped solid-state laser is well known, wherein a solid-state laser crystal doped with rare earth elements such as Neodymium is pumped with a laser diode (a semiconductor laser). In this laser-diode-pumped solid-state laser, an optical output thereof is detected by a photodetector, and a drive current of the laser diode is subjected to a feedback control on the basis of an output obtained from that detection. Thereby, so-called APC (automatic power control) is effected for maintaining an optical output at a predetermined value. Thus, the laser-diode-pumped solid-state laser is often used while being subjected to APC.

In this type of laser-diode-pumped solid-state laser, a multi-transverse mode broad area laser is often used as a laser diode in order to obtain a high pump power. More particularly, the multi-transverse mode broad area laser, conventionally used as such a pumping source, is of the gain-guided type which forms a guide mode using a current gain.

In the conventional laser-diode-pumped solid-state laser that uses the gain guide type multi-transverse mode broad area laser as a pump source, sharp output variations (so-called kinks), resulting from variations in drive current of the laser diode itself, and minute output variations and noise, caused by returning light which is reflected from a solid-state laser crystal or the like, occur. This may lead to a considerably deteriorated linearity of drive current vs. optical output characteristics of the laser diode. In such a case, it is impossible to suppress output variations of the solid-state laser or noise even when the laser is subjected to the aforementioned APC. What is worse, this causes the APC circuit to oscillate, which in turn causes new noise. This problem is particularly noticeable when the environmental temperature around the laser-diode-pumped solid-state laser varies.

SUMMARY OF THE INVENTION

In view of the foregoing observation, the object of the present invention is to provide a laser-diode-pumped solid-state laser in which output variations and noise can be reduced by improving the linearity of drive current vs. optical output characteristics of a laser diode of a pump source.

To this end, according to one aspect of this invention, there is provided a laser-diode-pumped solid-state laser in which a solid-state laser crystal is pumped by a laser beam emitted from a laser diode, comprising:

an index-guided type multi-transverse mode broad area laser having a single optical waveguide as said laser diode.

In this laser-diode-pumped solid-state laser, the index-guided type multi-transverse mode broad area laser has a front reflectivity of more than 20% with respect to a wavelength thereof.

In the index guide type multi-transverse mode broad area laser, a laser diode is provided with a wide three-dimensional optical waveguide which confines a number of transverse modes. When this laser diode is used as a pump source, it becomes difficult for sharp output variations called kinks to occur. Also, when the laser diode having a high front reflectivity (a reflectivity of more than 20% is more effective) is used as this multi-transverse mode broad area laser, minute output variations and noise resulting from the foregoing returning light are further reduced.

As a result of this, in the laser-diode-pumped solid-state laser of the present invention, output variations and noise of the solid-state laser beam are prevented.

In addition, if output variations and noise of the laser diode used as a pump source are suppressed in the manner as mentioned above, superior control effects will be obtained when the foregoing automatic power control is carried out. Moreover, it is possible to solve the problem of the oscillation of the APC circuit causing new noise.

BRIEF DESCRIPTION OF THE DRAWINGS

FIG. 7 is a graph showing the relationship between a laser diode drive current and an optical output when the front reflectivity of a laser diode of the laser shown in FIG. 5 is 20%;

FIG. 8 is a graph showing the relationship between a laser diode drive current and an optical output when the front reflectivity of a laser diode of the laser shown in FIG. 5 is 30%.

FIG. 13 is a plot showing the relationship of output variations and noise to the front reflectivity of the laser diode of the laser shown in FIG. 5.

DESCRIPTION OF THE PREFERRED EMBODIMENTS

With reference to the accompanying drawings, the present invention will be described in detail hereunder.

Figure 1:
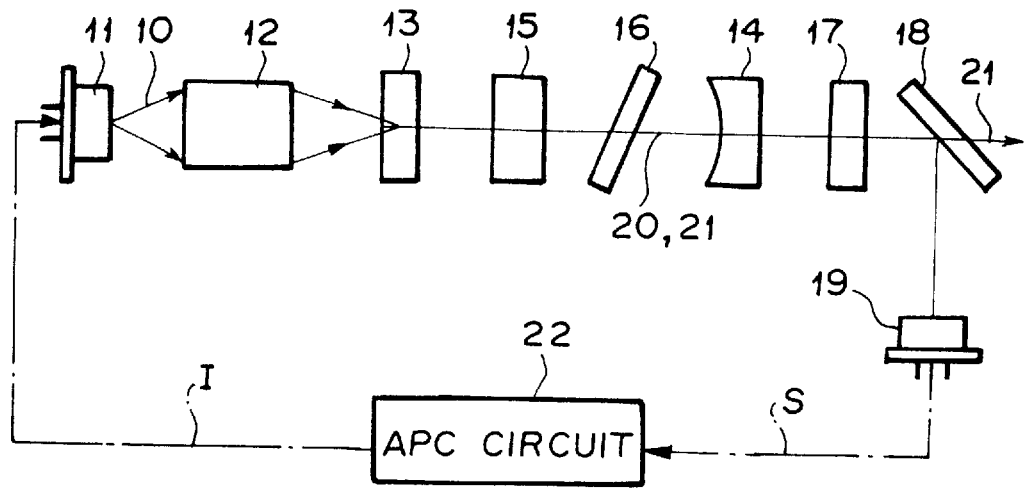
FIG. 1 is a schematic side view of a laser-diode-pumped solid-state laser according to a first embodiment of the present invention.

FIG. 1 shows a laser-diode-pumped solid-state laser according to a first embodiment of the invention. It is composed of: a laser diode 11 which emits a laser beam 10 as a pump beam; a condenser lens 12 consisting of, for example, a distributed index lens that converges diverging rays of the laser beam 10; a YAG crystal 13 (hereinafter referred to as Nd:YAG crystal) which is a solid-state laser medium doped with Neodymium (Nd); a resonator mirror 14 disposed (on the right side in the drawing) on the far side of this Nd:YAG crystal 13; a KN crystal 15 interposed between the resonator mirror 14 and the Nd:YAG crystal 13; and an etalon 16 interposed between the KN crystal 15 and the resonator mirror 14.

Moreover, on the far side of the resonator mirror 14, a blue color transmitting filter 17, which permits the transmission of a second harmonic wave 21 emitted in a manner described in greater detail below, and a partially transmitting mirror 18, which causes a part of the second harmonic wave 21 that has passed through the filter 17 to be reflected and bifurcated, are provided. The second harmonic wave 21 thus bifurcated is detected by a photodetector 19 such as a photodiode.

An index-guided type multi-transverse mode broad area laser (having an oscillation wavelength of 808.5 nm) having a single optical waveguide is used as the laser diode 11 which acts as a pump source. The front reflectivity of this laser diode 11 with respect to a wavelength of 808.5 nm is 30%.

On the other hand, the Nd:YAG crystal 13 has an Nd concentration of, for example, 1 at.% and a length of 1 mm. Neodymium atoms are pumped by an incoming laser beam 10 having a wavelength of 808.5 nm, as a result of which the Nd:YAG crystal 13 emits a laser beam 20 having a wavelength of 946.2 nm. This laser beam 20 is rendered in a single longitudinal mode by the etalon 16, and it is converted into a blue second harmonic wave 21 having a half wavelength, i.e., 473.1 nm by the KN crystal 15 which is a non-linear optical material. This second harmonic wave 21 transmits through the appropriately coated resonator mirror 14, and thereby exits the resonator.

A part of the second harmonic wave 21 is introduced to the photodetector 19 in the manner mentioned above, and an optical output $L_B$ thereof is detected by the photodetector 19. An APC circuit 22 controls a drive current I of the laser diode 11 on the basis of an optical detection signal S outputted from the photodetector 19, whereby the optical output of the second harmonic wave 21 is maintained at a constant value.

Figure 2:
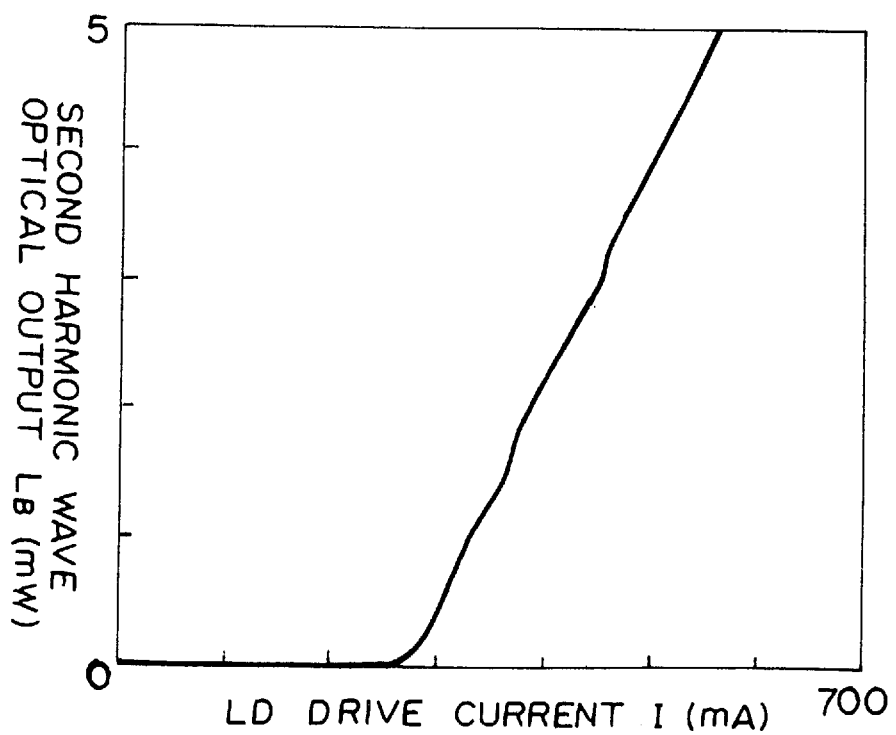
FIG. 2 a graph showing the relationship between a laser diode drive current and an output of a second harmonic wave in the laser shown in FIG. 1.

FIG. 2 shows the relationship between the drive current I of the laser diode 11 and the optical output $L_B$ of the second harmonic wave 21 when automatic power control is not carried out in this embodiment. As illustrated in FIG. 2, when the laser diode drive current I varies, neither distinguishing output variations nor noise occur in the second harmonic wave 21. It is deemed that this is so because an appropriate linearity of the drive current vs. output characteristics of the laser diode 11 is obtained. In this case, a stable control effect will be obtained when automatic power control is utilized.

Comparative Example 1

Figure 3:
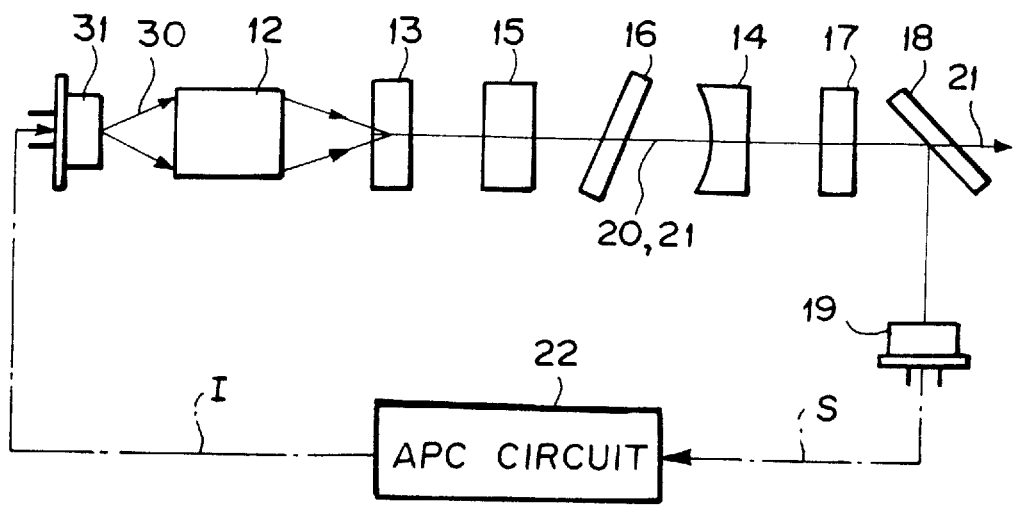
FIG. 3 is a schematic side view of a conventional laser-diode-pumped solid-state laser that is an example which will be compared to the first embodiment shown in FIG. 1.

To ascertain the benefits of the present invention over the conventional system, the laser diode 11 used in the configuration shown in FIG. 1 was replaced with a gain-guided type multi-transverse mode broad area laser 31 used in a conventional laser, whereby a comparative example shown in FIG. 3 was manufactured. An oscillation wavelength of this gain-guided type multi-transverse mode broad area laser 31 is 808.5 nm, and the front reflectivity of the laser with respect to this oscillation wavelength is 15%.

Figure 4:
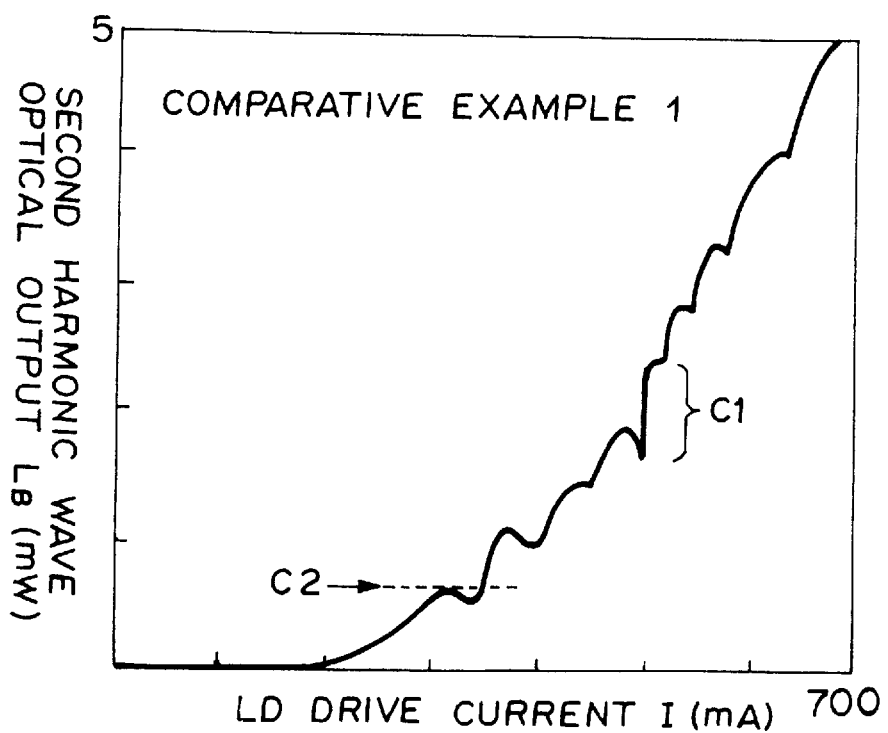
FIG. 4 is a graph showing the relationship between a laser diode drive current and an output of a second harmonic wave in the laser shown in FIG. 3.

FIG. 4 illustrates the relationship between the laser diode drive current I and the optical output $L_B$ of the second harmonic wave 21 when automatic power control is not carried out in the laser-diode-pumped solid-state laser of this comparative example 1. As shown in the drawing, distinct output variations arise in the second harmonic wave 21 as the laser diode drive current I varies. It is considered that this is because the linearity of the drive current vs. output characteristics of the laser diode is impaired. In this state, no stable automatic power control is obtained, and hence leaps in output are repeated.

At C1 in the curve shown in FIG. 4, optical outputs $L_B$ are completely or substantially the same with respect to one laser diode drive current I. This is because the laser diode 31 itself oscillates, which will induce noise when automatic power control is effected. At C2 in the curve shown in FIG. 4, optical outputs $L_B$ having the same value are obtained with respect to two laser diode drive currents I. In this state, the APC circuit 22 oscillates when automatic power control is carried out, which in turn causes circuit noise.

Figure 5:
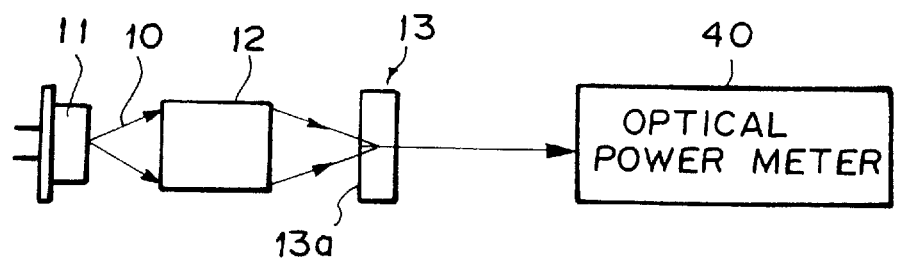
FIG. 5 is a schematic side view showing a laser-diode-pumped solid-state laser according to another embodiment of the present invention.

Referring to FIG. 5, a second embodiment of the present invention will be described. In this embodiment, in order to examine the characteristics of the laser diode, the resonator was removed from the entire construction. The laser-diode-pumped solid-state laser of this embodiment is made up of: the laser diode 11 which emits the laser beam 10 as a pump beam; the condenser lens 12 which converges the laser beam 10; and the Nd:YAG crystal 13 which is pumped by the laser beam 10.

As with the previous embodiment, the index-guided type multi-transverse mode broad area laser having a simple optical waveguide (having an oscillation wavelength of 808.5 nm) was used as the laser diode 11. Three types of laser were used as this laser diode 11, each having a respective front reflectivity of 7.5%, 20% and 30% with respect to the wavelength of 808.5 nm. In each case, an optical output $L_{LD}$ of the laser beam 10 having passed through the Nd:YAG crystal 13 was measured by a power meter 40. The reflectivity of a light entrance end surface 13a of the Nd:YAG crystal 13 with respect to the wavelength of 808.5 nm was adjusted to 5%. The relationship between the drive current I and the optical output $L_{LD}$ of the laser diode 11 in each case is shown respectively in FIGS. 6, 7 and 8.

Figure 9:
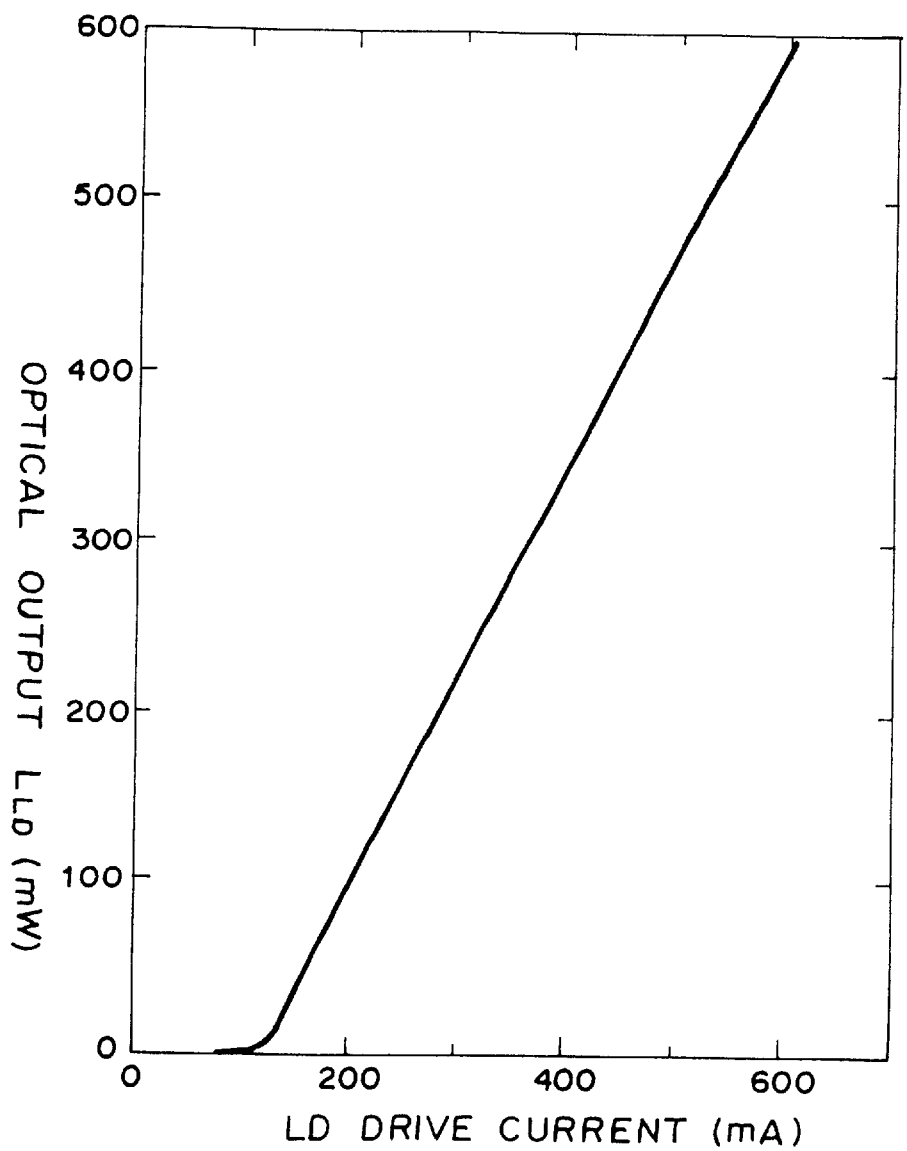
FIG. 9 is a graph showing the relationship between a laser diode drive current and an optical output when a laser diode is driven in a free-running state.

When the condenser lens 12 and the Nd:YAG crystal 13 were removed from the construction shown in FIG. 5, the laser diode 11 was driven in a free-running state. The optical output $L_{LD}$ of the laser 10 emitted in this state was directly measured by the optical power meter 40. FIG. 9 illustrates the relationship between the drive current I and the optical output $L_{LD}$ of the laser diode 11 obtained under these conditions. In this case, the index-guided type multi-transverse mode broad area laser having the front reflectivity of 30% with respect to the wavelength of 808.5 nm was used as the laser diode 11.

Comparative Example 2

Figure 10:
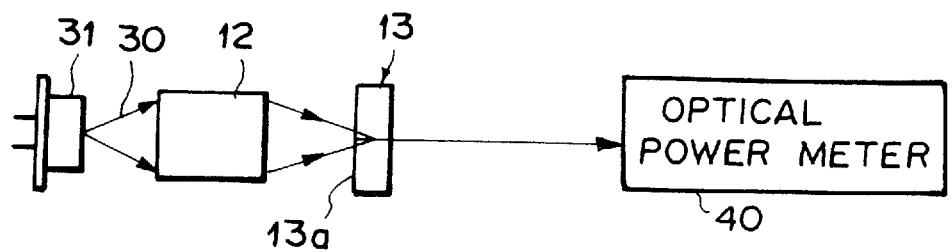
FIG. 10 is a schematic side view of a conventional laser-diode-pumped solid-state laser that is an example which will be compared to the laser of the second embodiment shown in FIG. 5.

A comparative example shown in FIG. 10 was manufactured by replacing the laser diode 11 used in the construction shown in FIG. 5 with the gain-guided type multi-transverse mode broad area laser 31 used in the conventional laser. The oscillation wavelength of this gain-guided type multi-transverse mode broad area laser is 808.5 nm, and the front reflectivity of this laser with respect to this oscillation wavelength is 15%. Also in this case, the reflectivity of the light entrance end surface 13a of the Nd:YAG crystal 13 with respect to the oscillation wavelength 808.5 nm was 5%.

Figure 11:
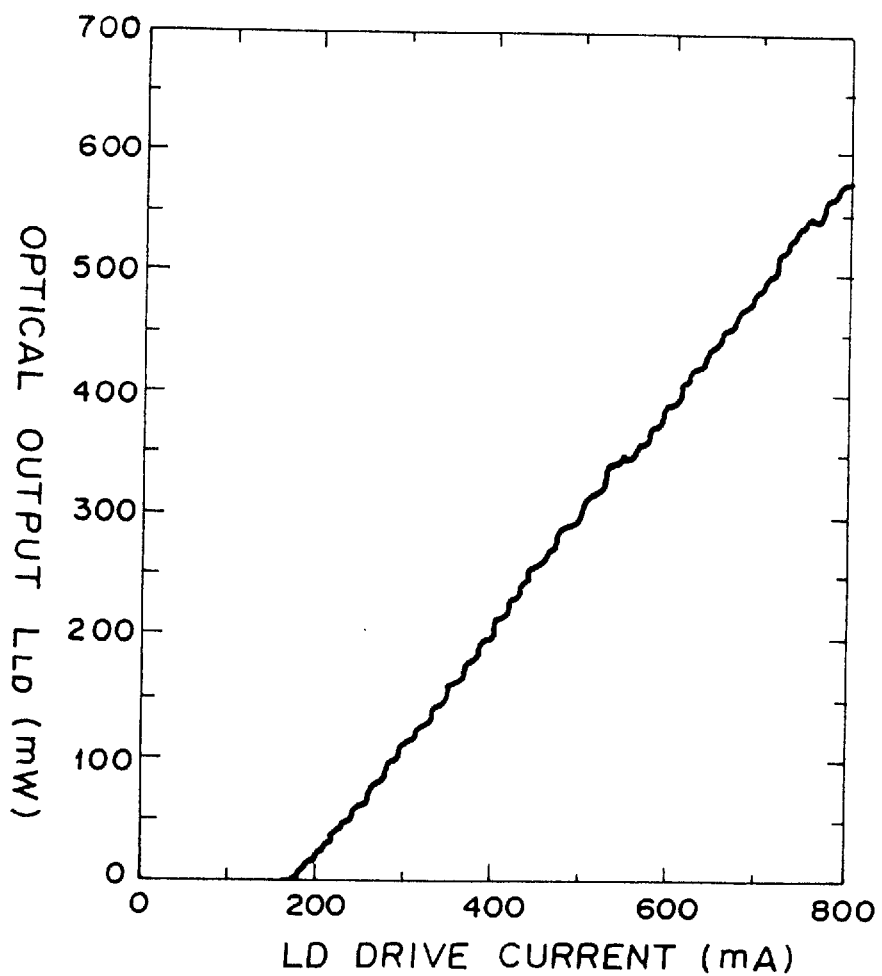
FIG. 11 is a graph showing the relationship between a laser diode drive current and an optical output in the laser shown in FIG. 10.
Figure 12:
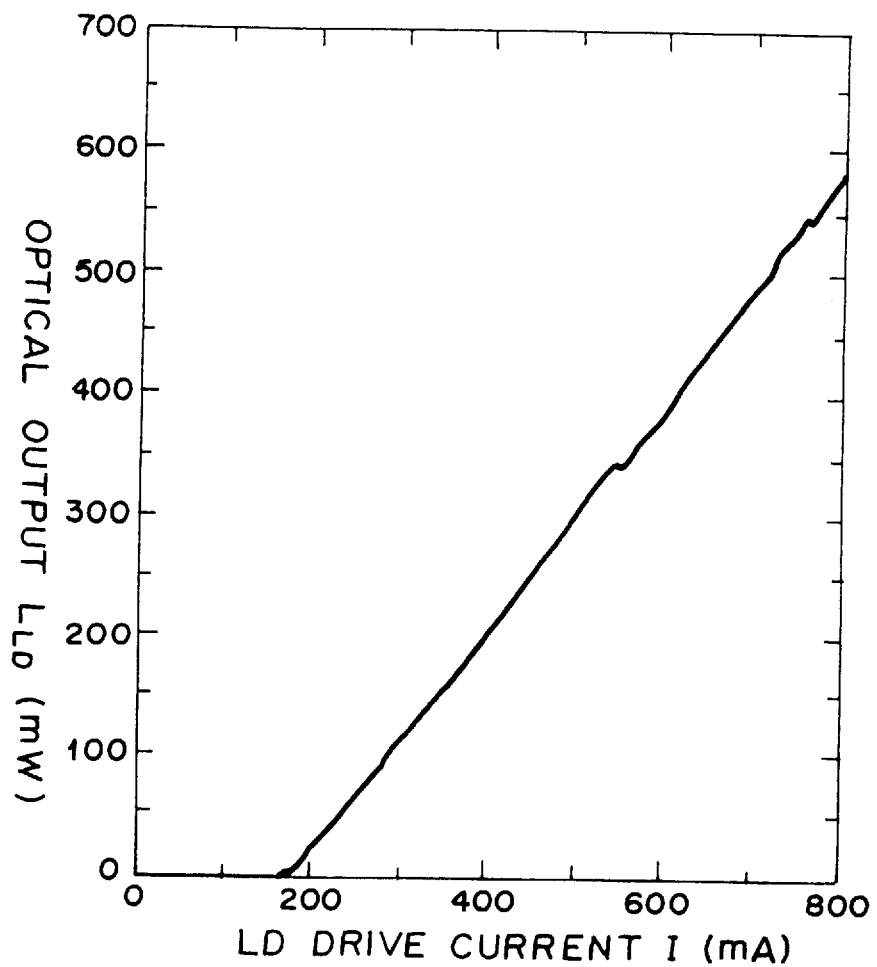
FIG. 12 is a graph showing the relationship between a laser diode drive current and an optical output when a laser diode used in the laser shown in FIG. 10 is rendered in a free-running state.

In this comparative example 2, the optical output $L_{LD}$ of the laser beam 10 having passed through the Nd:YAG crystal 13 was measured by the optical power meter 40. FIG. 11 shows the relationship between the drive current I and the optical output $L_{LD}$ of the laser diode 31 obtained at this time. When the condenser lens 12 and the Nd:YAG crystal 13 were removed from the construction, the laser diode 31 was driven in a free-running state. The optical output $L_{LD}$ of a laser beam 30 which is emitted from the laser diode 31 was directly measured by the optical power meter 40. FIG. 12 shows the relationship between the drive current I and the optical output $L_{LD}$ of the laser diode 31 obtained in this case.

In FIGS. 6, 7, 8, 9, 11, and 12, the optical output on the longitudinal axis is represented by a relative value. However, in FIGS. 6, 7, 8 and 11, which show the optical output $L_{LD}$ of the laser beam after having passed through the Nd:YAG crystal 13, absolute values in the full-scale longitudinal axis are equally shown. On the other hand, in FIGS. 9 and 12 which show the optical output $L_{LD}$ obtained when the diode is driven in the free-running state, absolute values in the full-scale longitudinal axis are equally represented.

As shown in FIG. 12, when the gain-guided type multi-transverse mode broad area laser 31 is driven in a free-running state, large output variations, i.e., so-called kinks, arise as the drive current I varies. Contrary to this, when the index-guided type multi-transverse mode broad area laser 11 is driven in a free-running state, no kinks appear, as shown in FIG. 9. As previously mentioned, the characteristics shown in FIG. 9 were obtained when the front reflectivity of the laser diode 11 was 30%. Similarly, in the case of laser diodes having either a front reflectivity of 7.5% or 20%, no kinks appeared.

In the construction (the second comparative example) shown in FIG. 10, using the gain-guided type multi-transverse mode broad area laser 31, large output variations due to kinks appear, as shown in FIG. 11, and minute output variations are also observed. These minute output variations are caused by the influence of returning light.

Figure 6:
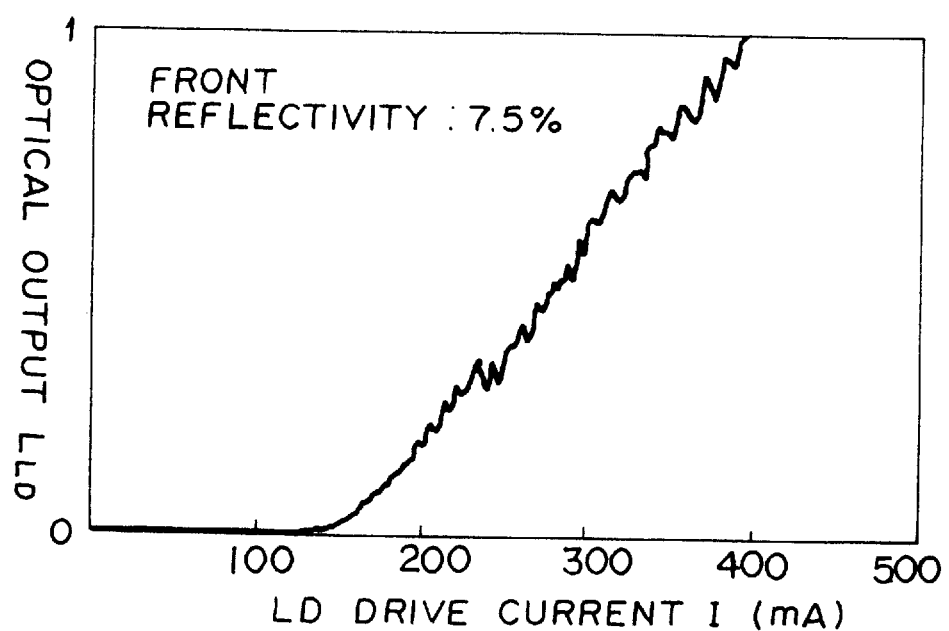
FIG. 6 is a graph showing the relationship between a laser diode drive current and an optical output when the front reflectivity of a laser diode of the laser shown in FIG. 5 is 7.5%.

On the other hand, in the construction shown in FIG. 5 in which the index-guided type multi-transverse mode broad area laser 11 is used, as a matter of course, no large output variations due to the foregoing kinks appear, as shown in FIGS. 6, 7 and 8. Moreover, as evident from FIGS. 6, 7 and 8, minute output variations, caused by the influence of returning light, tend to become smaller as the front reflectivity of the laser diode 11 is increased.

FIG. 13 shows results of the measurement of output variations and noise of the laser beam 10 in each of the cases where the front reflectivity of the laser diode 11 is respectively 7.5%, 20% and 30%. In these cases, the temperature of the atmosphere is varied in the range of 10°–40° C. at a variation rate of 60° C./unit time. As shown in FIG. 13, both output variations and noise evidently become smaller as the front reflectivity is increased. Particularly, when the front reflectivity is more than 20%, the output variations and noise sharply drop.

Thus, the explanations have been given of the embodiments using the Nd:YAG crystal as the solid-state laser crystal. However, the present invention is applicable to laser-diode-pumped solid-state lasers other than the foregoing types. In such a case, the same effects as mentioned in the above will be obtained.

Several embodiments of the invention have now been described in detail. It is to be noted, however, that these descriptions of specific embodiments are merely illustrative of the principles underlying the inventive concept. It is contemplated that various modifications of the disclosed embodiments, as well as other embodiments of the invention will, without departing from the spirit and scope of the invention, be apparent to persons versed in the art.

What is claimed is:

1. A laser-diode-pumped solid-state laser, comprising:

a pump source producing a pump beam; and a solid-state laser crystal pumped by the pump beam to emit a laser beam of a given wavelength;

wherein said pump source comprises an index-guided type multi-transverse mode broad area laser diode having a single optical waveguide.

2. The laser-diode-pumped solid-state laser as claimed in claim 1, wherein:

said index-guided type multi-transverse mode broad area laser is provided with a coating layer on a pump-beam output face thereof, said coating layer providing a front reflectivity of at least 20% with respect to an output wavelength of the pump beam.

3. The laser-diode-pumped solid-state laser as claimed in claim 1, wherein:

said index-guided type multi-transverse mode broad area laser is provided with a coating layer on a pump-beam output face thereof, said coating layer providing a front reflectivity of at least 30% with respect to an output wavelength of the pump beam.

4. The laser-diode-pumped solid-state laser as claimed in claim 1, wherein:

said solid-state laser crystal is yttrium aluminum garnet doped with neodymium.

5. The laser-diode-pumped solid-state laser as claimed in claim 1, further comprising:

a condenser lens interposed in a path of the pump beam between said laser diode and said solid-state laser crystal for receiving the pump beam and converging the pump beam on said solid-state laser crystal.

6. The laser-diode-pumped solid-state laser as claimed in claim 1, further comprising:

a resonator mirror disposed on an opposite side of said solid-state laser crystal from said laser diode;

a crystal of non-linear optical material interposed between said solid-state laser crystal and said resonator mirror in a path of the laser beam, for converting the laser beam into a second harmonic wave; and an etalon interposed between said crystal of non-linear optical material and said resonator mirror in a path of the second harmonic wave, for rendering the second harmonic wave into a single longitudinal mode.

7. The laser-diode-pumped solid-state laser as claimed in claim 6, wherein said resonator mirror is disposed in a path of the second harmonic wave and transmits the second harmonic wave, said solid-state laser further comprising:

a partially transmitting mirror disposed in a path of the second harmonic wave transmitted by said resonator mirror and separating the second harmonic wave into a first portion and a second portion;

a photodetector disposed in a path of the first portion for converting the first portion into an optical feedback signal;

an automatic power control circuit for outputting a current in accordance with the optical feedback signal, wherein the current is supplied to said index-guided type multi-transverse mode broad area laser diode as a drive current therefor.

8. A laser-diode-pumped solid-state laser, comprising:

a pump source producing a pump beam;

a solid-state laser crystal pumped by the pump beam to emit a laser beam of a given wavelength;

a photodetector disposed in a path of the laser beam for detecting the beam and converting the beam into an optical feedback signal; and an automatic power control circuit for outputting a current in accordance with the optical feedback signal to said pump source as a drive current for said pump source;

wherein said pump source comprises an index-guided type multi-transverse mode broad area laser diode having a single optical waveguide.

* * * * *